United States Patent [19]

White

[11] Patent Number: 5,101,638
[45] Date of Patent: Apr. 7, 1992

[54] MAGNETIC FIELD GENERATING SYSTEM

[75] Inventor: Keith White, Oxfordshire, England

[73] Assignee: Oxford Advanced Technology Limited, Oxford, England

[21] Appl. No.: 579,685

[22] Filed: Sep. 10, 1990

[30] Foreign Application Priority Data

Sep. 8, 1989 [GB] United Kingdom ............... 8920345

[51] Int. Cl.⁵ .................. F25B 19/00; H01F 7/00; H01F 5/08
[52] U.S. Cl. ................................. 62/51.1; 505/892; 335/216; 335/300; 324/318
[58] Field of Search ............... 324/320, 318; 62/51.1; 335/216, 300; 505/891, 892

[56] References Cited

U.S. PATENT DOCUMENTS

| 4,448,042 | 5/1984 | Yamaguchi et al. | 505/892 X |
|---|---|---|---|
| 4,535,595 | 8/1985 | Keller et al. | 505/892 X |
| 4,655,045 | 4/1987 | Matsumoto et al. | 62/51.1 |
| 4,660,013 | 4/1987 | Laskaris et al. | 324/318 X |
| 4,689,970 | 9/1987 | Ohguma et al. | 62/51.1 |
| 4,777,807 | 10/1988 | White | 62/51.1 |
| 4,782,671 | 11/1988 | Breneman et al. | 335/216 X |
| 4,788,834 | 12/1988 | Usui et al. | 62/51.1 |
| 4,817,706 | 4/1989 | Miyama et al. | 335/300 X |
| 4,884,409 | 12/1989 | Quack et al. | 62/51.1 |
| 4,986,078 | 1/1991 | Laskaris | 62/51.1 |
| 4,990,878 | 2/1991 | Takechi et al. | 335/216 X |

FOREIGN PATENT DOCUMENTS 0149407  6/1989  Japan ................... 505/892

Primary Examiner—Henry A. Bennet
Assistant Examiner—Christopher B. Kilner
Attorney, Agent, or Firm—Staas & Halsey

[57] ABSTRACT

A magnetic field generating system comprises a magnetic field generator (1); and a cooling system (4) having at least one thermal shield (6) surrounding the magnetic field generator. The system further comprises a temperature monitor (14, 15) for monitoring the thermal shield temperature; and a heater (13) for selectively heating the thermal shield so as substantially to maintain the monitored temperature substantially constant.

14 Claims, 1 Drawing Sheet

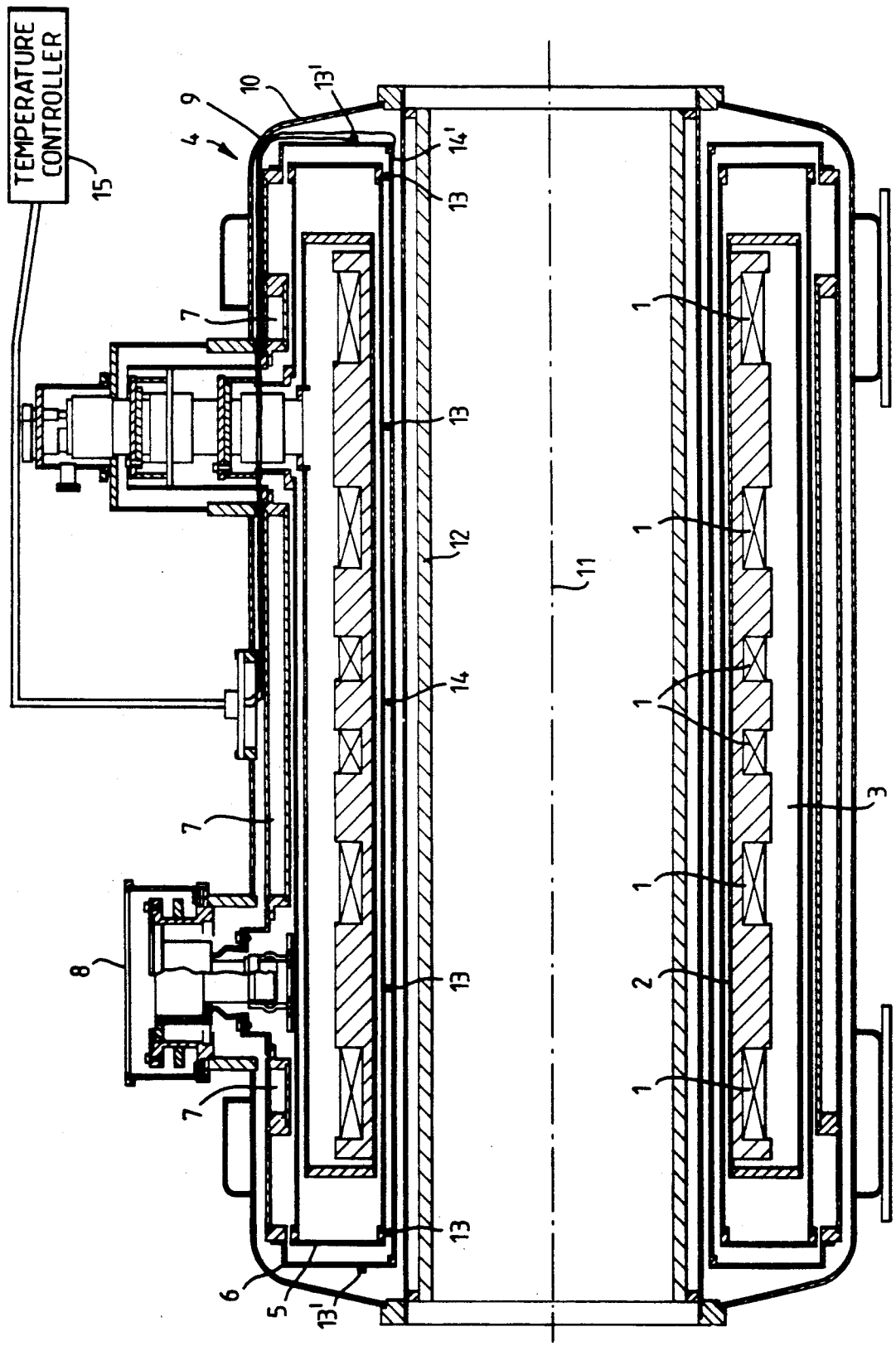

MAGNETIC FIELD GENERATING SYSTEM

FIELD OF THE INVENTION

The invention relates to a magnetic field generating system of the kind comprising a magnetic field generator; and a cooling system comprising at least one thermal shield surrounding the magnetic field generator. Such systems are hereinafter referred to as of the kind described.

DESCRIPTION OF THE PRIOR ART

Systems of the kind described are commonly found in the form of superconducting magnets. In such magnets it is necessary to cool the electrical conductors down to the superconducting or critical temperature and this involves placing the magnetic field generator in the form of electrical coils within a cryostat. Superconducting magnets find a particular application in magnetic resonance imaging (MRI) in which a main magnetic field is generated and then a set of magnetic field gradients are superimposed on the magnetic field in a working volume in a predetermined, pulsed sequence to isolate regions of a body being imaged. Normally the gradient coils used to produce these gradient fields are resistive and are placed within the bore of the main magnet. Thus, the gradient coils are surrounded by a cold metallic lump. Pulsing the gradient coils causes eddy currents to be induced in the shields of the cryostat. The flow of eddy currents causes power in the form of I²R or Joule heating losses to be dissipated in the shields causing them to heat up. When the shields start to heat up the electrical conductivity of the shield, in which the eddy currents flow, changes. This causes the amount of eddy current flowing to be changed. The change is a function of time. The magnetic flux density (B) at a point in space due to a current flowing somewhere is given by the integral form of the Biot-Savart Law (in MKS units):

$$B = \frac{\mu_0}{4\pi} \int_v \frac{J \times U}{r^2} dv \qquad (1)$$

Where $\mu_o = 4\pi \times 10^{-7}$ The permeability of free space, $\int_v dv$ = Integral over the volume $V$ containing currents, $J$ = Current density,
$X$ = Vector cross product,
$U$ = Unit vector pointing from current density point to field point, and
$r$ = Distance from current density point to field point.

Therefore if the eddy current density, J, is a function of time, B will also be a function of time. This means that time varying eddy currents flowing in the shields of a magnet system will cause a time varying perturbation of the main magnet field. The field gradients are produced by a gradient power supply driving current through a gradient coil set. The eventual purpose is to produce a field gradient step with sharp boundaries having no overshoot nor droop. The gradient coils are surrounded by the shields (in particular) in which eddy currents are generated. These eddy currents produce magnetic fields which oppose the setting up of the field gradients. The gradient power supply is therefore "compensated" with one or more time constants so that the driving current waveform is no longer simple but is adjusted so as to compensate for the effects of the eddy currents. This compensation adjustment can be a time-consuming process of trial and error so as to produce an acceptable gradient waveform. If now the eddy currents in the shields change because the shield temperature is changed, then the compensation adjustment will need to be changed, in order to maintain image quality.

It is therefore important that the electrical conductivity of the shield stays constant. In systems which only have a refrigerator to cool the shields, there is a particular problem since the temperature of refrigeration is invariably dependent on the power which the refrigeration is required to absorb. If the power changes as a result of eddy currents then the refrigerated temperature will change, this effect being in addition to extra temperature differences through the metal of the shield which are necessary to conduct the heat to the refrigerator. One possibility would be to provide a shield which could be driven to a sufficiently low temperature at all times, then the resistance of the shield, in the "residual resistivity region", is substantially constant regardless of temperature. However, this would require a refrigerator of excessive power and cost, and the required temperature range would change with the purity and type of material.

SUMMARY OF THE INVENTION

In accordance with one aspect of the present invention, a magnetic field generating system comprises a magnetic field generator; and a cooling system having at least one thermal shield surrounding the magnetic field generator, characterized in that the system further comprises heating means for selectively heating the thermal shield so as substantially to maintain the thermal shield temperature at a reference temperature.

In accordance with a second aspect of the present invention a method of operating a magnetic field generating system comprising, a magnetic field generator; and a cooling system having at least one thermal shield surrounding the magnetic field generator, and heating means for selectively heating, the thermal shield, comprises selectively energizing the heating means so as substantially to maintain the thermal shield temperature at a reference temperature.

This invention has the advantage that heating means, for example, in the form of one or more small heaters, can be used to deal with the eddy current problem that would be incurred by using only a refrigerator.

Typically, where the system includes at least one gradient coil, the heating means will be more energized (deliver more heating power) when the gradient coil is not energized and will be less energized (deliver less heating power) when the gradient coil is energized.

The invention is applicable to a wide variety of magnetic field generating systems of the kind described (particularly superconducting systems) but is particularly useful in refrigerated systems and is even more important in systems with only one thermal shield. This is because typical shield material, such as aluminium or copper, has a low emissivity and high thermal conductivity in order to reduce heat input to the lower temperature parts of the system. Because of this requirement it will also have a large variation of electrical resistivity with temperature. Thus, the purer the material, the better the thermal performance but the more the resistivity variation. Although the weight of the shield could be increased to reduce daily changes, this means that thick shields are needed which take up space and lead to a system weight penalty.

The invention may also have application in a magnet system where the outer shield is cooled only by a liquid nitrogen vessel, since the shield bore temperature can change significantly as the level of liquid nitrogen in the vessel falls and also as the gradient pulsing is turned on and off.

The invention enables good images to be achieved in an MRI system by accommodating the rise in temperature due to eddy currents and joule heating caused by gradient coils rather than trying to suppress such heating. Thus, in one example the refrigerated outer shield bore temperature is about 60 K while that temperature will rise to about 70 K when pulsed gradients are energized. The heating means will therefore be controlled to maintain the 70 K temperature so that the temperature remains substantially constant.

A simple temperature controller could be used to provide adequate temperature control for the purposes of eddy current heating compensation. In particular, it is quite possible that no electronic controller is needed. If the average power delivered by the gradient eddy currents is reasonably constant over the period of imaging, then compensation could be achieved by simply switching off a suitably powered heater during the imaging periods, and switching it back on again between imaging periods. In this way the average power to the shield is constant so its temperature will not change. The switching could be manual, in which case the operator must remember to do it, or it could be linked to the imaging process by some simple electronic means, i.e., the control which initiates and stops the imaging sequence could be used to turn off and on the heater.

BRIEF DESCRIPTION OF THE DRAWINGS

An example of a superconducting magnet according to the invention will now be described with reference to the accompanying drawing which is a longitudinal section through the magnet assembly.

DESCRIPTION OF THE PREFERRED EMBODIMENT

The magnet assembly shown in the drawing comprises a superconducting magnet formed from a series of sets of electrical turns 1 mounted on a former 2 which defines a wall of a liquid helium containing vessel 3. The vessel 3 forms part of a cryostat 4 which includes an inner thermal shield 5 surrounding the helium vessel and an outer thermal shield 6 surrounding the inner shield 5. The outer shield 6 supports a liquid nitrogen vessel 7. In order to increase the thermal shielding effect of the cryostat, a refrigerator 8 is provided coupled with the liquid nitrogen vessel 7 and the inner shield 5.

An evacuated region 9 is defined in the connected spaces between the helium vessel 3 and the inner shield 5, the inner shield 5 and the outer shield 6, and the outer shield 6 and an outer wall 10.

The various shields and walls are concentric with the axis 11 of the magnet bore.

Mounted within the bore is a cylindrical, gradient coil former 12. For clarity, the gradient coils have been omitted from the drawing.

In an MRI experiment, the body to be inspected is positioned in the bore of the magnet with the main coil energized and thereafter the gradient coils are sequentially pulsed and a rf signal sensed.

As has previously been explained, the pulsing of the gradient coils leads to the generation of eddy currents within the walls of the cryostat, for example, the inner and outer shields 5,6, with a resultant increase in temperature in the shields. Thus, pulsing a gradient coil inside the magnet will cause the temperature of the shields to rise from an initial minimum temperature and fluctuate about a long-term average. The temperature will only fall back to the minimum if the gradients are quiescent for a period of some days.

In order to reduce the problem of changing eddy currents, in one example, a set of heaters 13 are mounted on the outer shield 6 on the side of the shield 6 facing the inner shield 5. In addition, a thermometer 14 is mounted to the outer shield 6 so as to monitor its temperature. The heaters 13 and the thermometer 14 are coupled to a temperature controller 15 incorporating a microprocessor. A suitable thermometer is the temperature sensor type CLTS (DCZ0042) made by Micro-Measurement Division, Measurements Group Inc., Raleigh, N. C., U.S.A. Other sensors may be based on the base-emitter junction of a small transistor. The forward voltage/current characteristic of the junction (which is, in effect, a semi-conductor diode) is dependent on its temperature, so that the voltage required to drive a fixed current through the diode increases as the temperature of the diode decreases. There are many other forms of cryogenic temperature sensors commercially available which would be adequate to measure the shield temperature. Ideally, they would be insensitive to gross, steady magnetic fields (although this is not absolutely necessary, since the magnetic field is substantially constant when the system is operating), they should not be sensitive to changing magnetic fields (non-inductive), they should respond to changes in temperature reasonably quickly compared with the rate of change of shield temperature, and they should not be of very large dimensions. Many commercial sensors will meet these requirements.

The thermometer must be attached to the shield so that there is little difference in temperature between the sensor and the shield. This requires that the sensor and its wiring should be attached with care and that the power dissipated in the device by the measuring device should be small. Suitable heaters are 47 ohm, 25 watt wirewound (Type 157-572) obtained from RS Components Ltd, Duddeston Mill Industrial Estate, Saltley, Birmingham, B81BQ. Such resistors have wire-wound elements surrounded by a silicone compound and housed in an anodized aluminium case which has two lugs for bolting to a surface. In general the heaters may be any form of low temperature resistive heating element which can be closely thermally linked to the metal of the shield(s) whilst maintaining electrical isolation, and which does not produce any appreciable magnetic field (non-inductive). A heat conducting compound (vacuum grease, which is well known in the cyrogenics industry) can be used between the base of the heater and the heated surface to improve thermal contact, but compounds other than vacuum grease might be suitable, as will other forms of heaters.

The temperature controller 15 monitors the temperature of the outer shield 6 as sensed by the thermometer 14, compares the monitored temperature with an internal reference temperature amplifies the difference (error) and uses the error signal to change the power delivered to the heater in such a way as to reduce the error signal, and thus selectively controls the energization of the heaters 13 so as to maintain the outer shield 6 at the reference temperature, for example, 70K. It should be noted that the heaters 13 must be non-inductive so as not to affect imaging. Thus, the heater power is increased at the time the gradient coil is switched off so that the temperature can be maintained at the reference temperature. Then when the gradient coils are turned on again the heater power is reduced and the shields will again remain at the reference temperature.

A particular example of a temperature controller is the ITC4 which is capable of using a number of different types of commercial temperature sensors, and contains data stored in a memory chip for automatic linearization (conversion from raw measurement to temperature) of these sensors. Its microprocessor may also be externally programmed with linearizing data for the operator's particular temperature sensor. The ITC4 is sold by Oxford Instruments Limited.

The ITC4 is a "3 term controller" in that it provides the following signals to the output heater control circuit (not shown) which controls the heaters:

1. Proportional, i.e., the error signal multipled by the gain, or amplification, selected by the operator.
2. Integral, i.e., the time integral of the error signal, with a time constant selected by the operator.
3. Differential, i.e., the time differential, or rate of change of the error signal with time, with a time constant selected by the operator.

In order to obtain the best response, i.e., the quickest return to the set temperature after a disturbance, the amount of gain and the integral and differential time constants are chosen by the operator to suit the particular system being controlled.

The arrangement of the heaters 13 is preferred for best temperature control but has the problem that there is only limited space available for the heaters. A more practical arrangement is also illustrated in the drawing. In this arrangement, heaters 13' are mounted to the axial end walls of the outer shield 6 while a thermometer 14' is mounted at one end of the radially inner wall of the outer shield 6. This is generally easier to assemble while the position of the thermometer 14' is a compromise between response to bore heating and response to heater power change.

Typically, the heaters will comprise electrical coils capable of delivering 40 watts each.

I claim:

1. A magnetic field generating system, comprising:
   a magnetic field generator;
   a cooling system having at least one thermal shield surrounding said magnetic field generator;
   heating means for selectively heating said thermal shield; and
   control means for selectively heating said thermal shield; and
   control means for selectively activating said heating means during operation of the magnetic field generating system so as substantially to maintain the thermal shield temperature at a reference temperature and thereby maintain the electrical conductivity of said thermal shield substantially constant.

2. A system according to claim 1, further comprising:
   a temperature monitor for monitoring said thermal shield temperature.

3. A system according to claim 2, wherein said temperature monitor includes:
   a temperature detector for sensing the temperature of said thermal shield; and
   comparison means for comparing said detected temperature with said reference temperature; and
   wherein said control means selectively activates said heating means so as to maintain said detected temperature at substantially said reference temperature.

4. A system according to claim 3, wherein:
   said comparison means and control means include a suitably programmed microprocessor.

5. A system according to claim 1, wherein:
   heating means is mounted on said thermal shield.

6. A system according to claim 1, wherein said magnetic field generator includes:
   a main field generator; and
   gradient magnetic field generating means for generating at least one gradient magnetic field.

7. A system according to claim 6, wherein said control means includes:
   means for selectively activating said heating means during a pulse operation of said gradient magnetic field generating means.

8. A system according to claim 1, further comprising:
   a cryostat surrounding at least a portion of said magnetic field generator so as to cause said portion to be superconducting, and wherein said cryostat includes said thermal shield.

9. A method of operating a magnetic field generating system comprising a magnetic field generator, a cooling system having at least one thermal shield surrounding the magnetic field generator, and heating means for selectively heating the thermal shield, the method comprising the step of:
   selectively energizing said heating means during operation of the magnetic field generating system so as substantially to maintain said thermal shield temperature at a reference temperature and thereby maintain the electrical conductivity of said thermal shield substantially constant.

10. A method according to claim 9, further comprising the step of:
    monitoring the thermal shield temperature and selectively energizing said heating means when the monitored temperature differs from the reference temperature.

11. A method according to claim 9, further comprising the step of:
    generating a gradient magnetic field with gradient magnetic field generating means.

12. A method according to claim 11, wherein said step of selectively energizing said heating means includes the steps of:
    energizing said heating means when said gradient magnetic field generating means is de-energized; and
    de-energizing said heating means when said gradient magnetic field generating means is energized.

13. An apparatus having a magnetic field generating system for performing a nuclear magnetic resonance experiment, comprising:
    a magnetic field generator having a main field generator and a gradient field generating means for generating a gradient magnetic field;
    a cooler having a thermal shield surrounding said magnetic field generator;
    heating means for selectively heating said thermal shield; and
    control means for selectively activating said heating means during operation of the magnetic field generating system so as to substantially maintain the temperature of said thermal shield at a reference temperature and thereby maintain the electrical conductivity of said thermal shield substantially constant, said control means including means for selectively activating said heating means during a pulse operation of said gradient magnetic field operating means.

14. A method of operating an apparatus for performing a nuclear magnetic resonance experiment, the apparatus having a magnetic field generating system comprising a magnetic field generator having a gradient magnetic field generating means for generating a gradient magnetic field, a cooler having a thermal shield surrounding the magnetic field generator, and heating means for selectively heating the thermal shield, comprising the step of:

selectively energizing the heating means during operation of the magnetic field generating system so as to substantially maintain the temperature of the thermal shield at a reference temperature and thereby maintain the electrical conductivity of the thermal shield substantially constant.

* * * * *